United States Patent [19]
McBride et al.

[11] Patent Number: 5,348,913
[45] Date of Patent: Sep. 20, 1994

[54] METHODS FOR ENCAPSULATING ELECTRONIC DEVICES

[75] Inventors: Richard McBride, Trenton; Ching-Ping Wong, Lawrenceville, both of N.J.

[73] Assignee: AT&T Bell Laboratories, Murray Hill, N.J.

[21] Appl. No.: 102,926

[22] Filed: Aug. 6, 1993

[51] Int. Cl.$^5$ .............................. H01L 21/60
[52] U.S. Cl. ................... 437/209; 437/210; 437/211; 437/219; 148/DIG. 17; 134/1
[58] Field of Search ............... 437/209, 210, 211, 219, 437/224; 148/DIG. 17; 134/1, 902

[56] References Cited

U.S. PATENT DOCUMENTS

| | | | |
|---|---|---|---|
| 4,983,548 | 1/1991 | Uno et al. | 148/DIG. 17 |
| 4,984,597 | 1/1991 | McConnell et al. | 134/902 |
| 5,028,560 | 7/1991 | Tsukamoto et al. | 148/DIG. 17 |
| 5,151,135 | 9/1992 | Magee et al. | 148/DIG. 17 |
| 5,158,616 | 10/1992 | Kinoshita et al. | 134/902 |
| 5,203,798 | 4/1993 | Watanabe et al. | 134/902 |
| 5,240,018 | 8/1993 | Clark et al. | 134/902 |

OTHER PUBLICATIONS

"Electrical Performance and Reaction Kinetics of Silicone Gels," C. P. Wong, *Journal of Material Research*, vol. 5, No. 4, Apr. 1990, pp. 795–800.

"Understanding the Use of Silicone Gels for Non-Hermetic Plastic Packaging," C. P. Wong et al., *IEEE Transactions on Components, Hybrids, and Manufacturing Technology*, vol. 2, No. 4, Dec. 1989, pp. 421–425.

*Primary Examiner*—Brian E. Hearn
*Assistant Examiner*—Kevin M. Picardat
*Attorney, Agent, or Firm*—Roderick B. Anderson

[57] ABSTRACT

In a preferred embodiment of the invention, a substrate (11) is cleaned by immersing it in an organic solvent (17) and subjecting it to acoustic energy, immersing it in alcohol, immersing it in a surfactant, subjecting it to a cascading rinse in deionized water, baking it (FIG. 3), and thereafter subjecting it to ultraviolet light in an ozone ambient (FIG. 4). When the foregoing steps are followed, the contact angle is significantly reduced, and an encapsulant (14) that is thereafter applied provides more reliable protection to an encapsulated device (12) from outside contaminants.

15 Claims, 1 Drawing Sheet

METHODS FOR ENCAPSULATING ELECTRONIC DEVICES

TECHNICAL FIELD

This invention relates to methods for encapsulating electronic devices and, more particularly, to methods for encapsulating electronic devices with plastic materials.

BACKGROUND OF THE INVENTION

Considerable effort has been made to develop a plastic non-hermetic encapsulant for electronic devices which protects such devices from the environment to a degree comparable to that provided by hermetically sealed packages, but which is easier to make than hermetically sealed packages. The papers, "Electrical Performance and Reaction Kinetics of Silicone Gels," C. P. Wong, *Journal of Material Research*, Vol. 5, No. 4, April 1990, pp. 795–800, and "Understanding the Use of Silicone Gels for Nonhermetic Plastic Packaging," C. P. Wong et at., *IEEE Transactions on Components, Hybrids and Manufacturing Technology*, Vol. 12, No. 4, December 1989, pp. 421–425, describe the use of silicone resins as encapsulants for electronic devices, particularly integrated circuits. Such encapsulants typically encase the device and adhere both to the device and a substrate on which the device is mounted.

Although silicone encapsulants provide a significant measure of protection from the environment, our studies have indicated that, with ever higher requirements for the dependability of integrated circuits, even greater reliability is needed. Particularly under extreme conditions of temperature and humidity, and with high integrated circuit bias voltages, failures of the integrated circuits may still occur. With certain complex circuits, more protection is required because only a minute amount of corrosion of a conductor can cause a failure. There is therefore a continuing need for integrated circuit encapsulants that give a higher degree of protection from outside contaminants, particularly under conditions of high temperature and humidity, or with high voltage or current conduction by the encapsulated integrated circuit. Methods for applying the encapsulants should not require materials that are hazardous to the environment.

SUMMARY OF THE INVENTION

Our studies have shown that contaminants tend to penetrate the encapsulant along the interface of the encapsulant and the substrate. We have found that such penetration can be considerably reduced by increasing the degree to which the uncured encapsulant wets the substrate. When there is complete wetting of the substrate, the encapsulant penetrates microscopic fissures in the substrate and provides better protection after it has hardened. The degree to which the uncured or fluid encapsulant wets the substrate is inversely proportional to the contact angle that a liquid drop makes with the substrate, that is, the angle a tangent to the meniscus of the drop makes with the surface of the substrate. When this angle is zero degrees, there is maximum wetting of the substrate by the fluid encapsulant.

We have further found that the contact angle can be significantly reduced by immersing the substrate in an organic solvent, subjecting the substrate to acoustic energy, removing the substrate, and thereafter exposing the substrate to ultraviolet light in an environment containing ozone.

In a preferred embodiment of the invention, the substrate is cleaned by immersing it in an organic solvent and subjecting it to acoustic energy, immersing it in alcohol, immersing it in a surfactant, subjecting it to a cascading rinse in deionized water, baking it, and thereafter subjecting it to ultraviolet light in an ozone ambient.

When the foregoing steps are followed, the contact angle is significantly reduced, and the encapsulant that is thereafter applied provides more reliable protection to an encapsulated device from external contaminants. These and other objects, features and benefits of the invention will be better understood from a consideration of the following detailed description taken in conjunction with the accompanying drawing.

DETAILED DESCRIPTION

Figure 1:
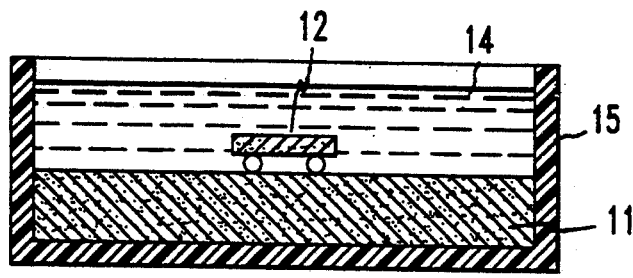
FIG. 1 is a sectional view of an encapsulated integrated circuit device.

The drawings are intended to be schematic in nature, with the dimensions in some cases being distorted to aid in clarity of the description. Referring now to FIG. 1, there is shown a substrate 11 upon which has been mounted an integrated circuit 12. The integrated circuit is protected from the environment by an encapsulation 14 of a plastic material such as silicone resin. The encapsulant is contained within a container 15. As is known in the art, the encapsulant is initially applied in a fluid condition, as is shown, and is thereafter cured or hardened such that it constitutes a permanent protective covering for the integrated circuit 12. If the encapsulant is a silicone resin, it is typically heated to cure it or polymerize it into a solid encapsulant.

The purpose of the encapsulant 14 is to protect the integrated circuit 12 from the effects of outside contaminants such as water vapor. Our studies have shown that such contaminants sometimes can penetrate the encapsulant along the interface of the encapsulant 14 and the substrate 11.

Our studies have further indicated that such penetration can be considerably reduced by increasing the degree to which the uncured encapsulant in its fluid state wets the substrate. When, prior to cure, there is complete wetting of the substrate, the fluid encapsulant penetrates microscopic fissures in the substrate and adheres better to the substrate after it has hardened. It can be shown that the degree to which the uncured or fluid encapsulant wets the substrate is inversely proportional to the contact angle that a drop of water makes with the substrate. That is, it is inversely proportional to the angle a tangent to the meniscus of a drop of water would make to the surface of the substrate. When this angle is zero degrees, there is maximum wetting of the substrate by the fluid. If this angle is large, such as fifty or sixty degrees, there is visible "beading" of the fluid on the surface of the substrate and little wetting.

Figure 2:
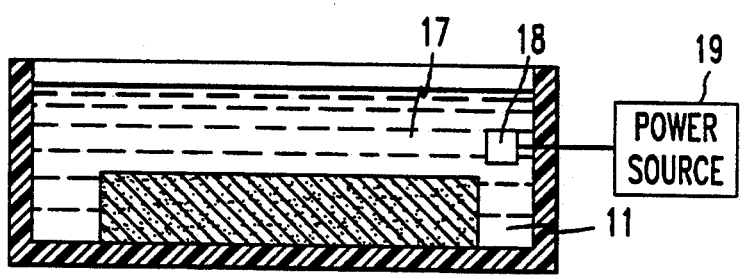
FIG. 2 is a sectional view of apparatus for cleaning the substrate of the apparatus of FIG. 1.

We have further found that the contact angle can be significantly reduced by immersing the substrate in an organic solvent, subjecting the substrate to acoustic energy, removing the substrate, and thereafter exposing the substrate to ultraviolet light in an environment containing ozone. Referring to FIG. 2, before the integrated circuit 12 of FIG. 1 is bonded, the substrate 11 is placed in a bath of an organic solvent 17. The organic solvent may be a terpene-based solvent or a mixture of d-limonene and isopropanol. During its immersion, it is subjected to ultrasonic acoustic energy from a transducer 18 supplied by a power source 19. The apparatus of FIG. 2 may be embodied by any of various ultrasonic bath devices that are commercially available. The substrate is preferably immersed in a separate bath of organic solvent for five minutes before being immersed in the ultrasonic bath for five minutes.

Figure 3:
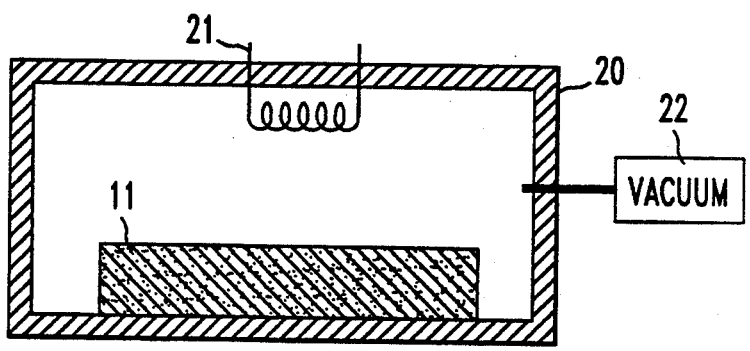
FIG. 3 is a schematic view of an oven for use with the substrate of FIG. 1.

Referring to FIG. 3, the substrate 11 is thereafter vacuum baked in an oven 20 heated by a heat source 21. A vacuum pump 22 maintains a predetermined gas pressure within the oven during baking. The substrate 11 may typically be vacuum baked at one hundred twenty degrees Centigrade for thirty minutes at a pressure of twenty-eight inches of mercury, which removes residual solvent on the substrate.

Figure 4:
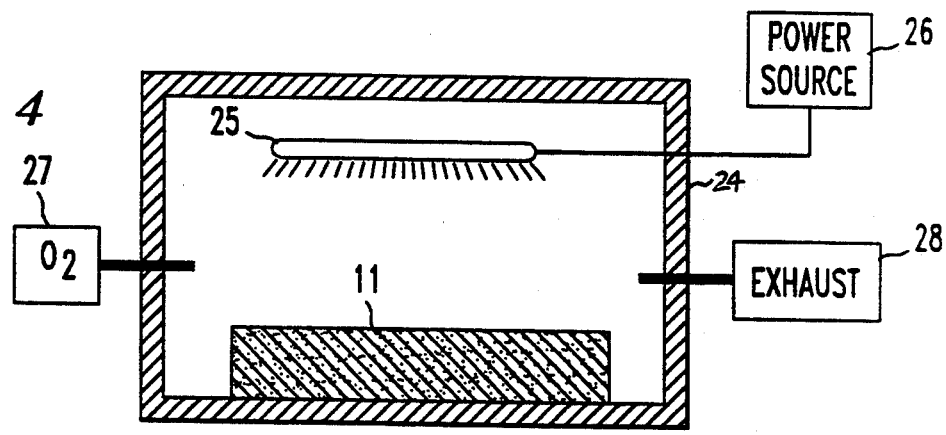
FIG. 4 is a view of ultra-violet apparatus for further treating the substrate of FIG. 1.

Referring to FIG. 4, the substrate 11 is thereafter subjected to ultraviolet ozone treatment in a container 24. An ultraviolet lamp 25 is powered by a source 26 to generate ultraviolet radiation directed at the substrate 11. Oxygen from a source 27 is directed into the container 24 and exhausted by an apparatus 28. The ultraviolet radiation directed through the oxygen converts the oxygen to ozone which reacts with the surface of substrate 11 to remove minute contaminants therefrom. The ultraviolet apparatus may be a commercially available device such as Model UV-1, available from Samco, Limited, Kyoto, Japan.

We have found that cleaning the upper surface of the substrate 11 as described above gives a contact angle between the surface and a drop of water that is near zero. As mentioned before, this constitutes the condition required for giving optimum adherence and optimum protection by an encapsulant coated on the surface. If the surface is cleaned by an organic solvent alone, or if it is cleaned by ultraviolet treatment alone, the contact angle is much much higher, usually in excess of forty degrees.

We have found even greater reliability in a preferred embodiment of the invention in which the substrate 11 is cleaned by immersing it in an organic solvent and subjecting it to acoustic energy, immersing it in alcohol, immersing it in a surfactant, subjecting it to a cascading rinse in deionized water, baking it, and thereafter subjecting it to ultraviolet light in an ozone ambient. In all embodiments, we have avoided using chlorofluorocarbons (CFCs) or other materials that could deleteriously affect the environment.

Four series of experiments were run for the purpose of determining contact angle after various processing procedures. In all of the experiments, the contact angle of a "sessile drop" of deionized water was measured with an instrument known as a goniometer; the instrument used was a Model 100-00, commercially available from the Rame-Hart Company, Mountain Lakes, N.J. A sessile drop is a drop of measured constant volume; it was made using a micrometer syringe.

EXAMPLE I

The contact angle measurements were made on substrates of silicon (Si), silicon dioxide ($SiO_2$), silicon nitride (SIN), and silicon oxynitride (SION). The measurement was made using an enclosed chamber at ambient temperature. The samples each stood in the chamber for five minutes to equilibrate with the chamber's one hundred percent relative humidity atmosphere. The sessile drop was allowed to equilibrate on the sample surface for five minutes, at which time a measurement was taken. Four processing conditions were measured:

In Process 1, the various substrates were measured for contact angle without any treatment whatever, for comparison purposes.

In Process 2, the substrate was cleaned with an organic solvent comprising a terpene-based solvent known as BIOACT EC-7®, which is available from the Petroferm Company, Fernandina Beach, Fla. There was a five minute immersion in the organic solvent, followed by a five minute immersion in the organic solvent in an ultrasonic bath. The substrate was then vacuum baked at one hundred twenty degrees Centigrade for thirty minutes at a pressure of twenty-eight inches of mercury.

In Process 3, the substrate was immersed in organic solvent for five minutes, immersed for five minutes in an organic solvent ultrasonic bath, followed by a five minute immersion in isopropyl alcohol in an ultrasonic bath. It was then vacuum baked at one hundred twenty degrees Centigrade for thirty minutes at a pressure of twenty-eight inches of mercury.

In Process 4, the substrate was immersed and cleaned in an organic solvent as in Process 2. Thereafter, it was subjected to five minutes of ultraviolet-ozone (UV-ozone) exposure at fifty degrees Centigrade, as illustrated in FIG. 4. The results of these experiments are shown in Table I.

TABLE I

| Process | Contact Angle (Degrees) Substrate | | | |
|---|---|---|---|---|
| | Si | $SiO_2$ | SiN | SiON |
| 1 | 47 | 44 | 31 | 34 |
| 2 | 49 | 54 | 43 | 49 |
| 3 | 49 | 57 | 45 | 51 |
| 4 | 0 | 6 | 0 | 0 |

Table I shows that the contact angle for untreated Si (Process 1) was forty-seven degrees, for untreated $SiO_2$, it was forty-four degrees, for SiN, thirty-one degrees and for SION, thirty-four degrees. With Processes 2 and 3, the contact angles were also very high, in excess of forty degrees. However, after Process 4, which included the UV ozone treatment, the contact angle was zero for the silicon, SiN and SiON substrates, indicating maximum wetting of the surfaces. It is useful to note that in Process 3, the additional bath in isopropyl alcohol does not, by itself, seem to improve the contact angle.

EXAMPLE II

The measurement conditions were the same as in Example I. A sessile drop of deionized water was used on substrates of Si, $SiO_2$, SiN and SION.

In Process 1, the substrates were measured as received with no additional treatment.

In Process 2, they were cleaned with organic solvent plus a surfactant treatment. They were immersed for five minutes in BIOACT EC-7, immersed for five minutes in an ultrasonic bath of BIOACT EC-7, were subjected to three five minute cascading deionized (DI)

water rinses, and were subjected to three five minute immersions in a 50 ppm (parts per million) solution of active surfactant in DI water. The active surfactant was Mirachem, available from Mirachem, Inc., Tempe, Ariz. It was then subjected to three successive five minute cascading DI water rinses, followed by a vacuum bake at one hundred twenty degrees Centigrade for thirty minutes at twenty-eight inches of mercury.

Process 3 included the UV-ozone treatment. The substrate was cleaned as in Process 2 and thereafter subjected to a five minute ultraviolet-ozone exposure as in FIG. 4 at fifty degrees Centigrade.

The results of the three processes are shown in Table II.

TABLE II

| Process | Contact Angle (Degrees) Substrate | | | |
|---|---|---|---|---|
| | Si | SiO$_2$ | SiN | SiON |
| 1 | 47 | 44 | 31 | 34 |
| 2 | 64 | 62 | 60 | 57 |
| 3 | 0 | 0 | 0 | 0 |

It is instructive to note that Process 2, which constituted a rather elaborate cleaning of the substrate, actually increased the contact angle, with respect to the untreated substrate of Process 1. The addition of the UV-ozone treatment, Process 3, reduced the contact angle to zero in all cases, which was better than that of Process 4, Table I, in which the SiO$_2$ contact angle was six degrees.

EXAMPLE III

Contact angle measurements were made on substrates of SiO$_2$ and SiON under the same conditions as described in Example I.

In Process 1, the contact angle was measured without any treatment.

In Process 2, organic solvent plus surfactant was used. The substrate was immersed for five minutes in BIOACT EC-7, followed by a five minute immersion in an ultrasonic bath of BIOACT EC-7. It was then immersed for five minutes in a solution of Mirachem, 50 ppm in DI water, followed by immersion in an ultrasonic bath of a solution of Mirachem, 50 ppm in DI water. It was then immersed for five minutes in isopropyl alcohol, followed by a five minute immersion in an ultrasonic bath of isopropyl alcohol. Next, it was subjected to three five minute cascading DI water rinses. It was vacuum baked at one hundred twenty degrees Centigrade for thirty minutes at twenty-eight inches of mercury and thereafter the contact angle was measured.

In Process 3, the substrate was cleaned as described in Process 2 and additionally subjected to five minutes of UV-ozone exposure at fifty degrees Centigrade as in FIG. 4.

The results are shown in Table III.

TABLE III

| Process | Contact Angle (Degrees) Substrate | |
|---|---|---|
| | SiO$_2$ | SiON |
| 1 | 41 | 30 |
| 2 | 42 | 35 |
| 3 | 0 | 0 |

Again, the elaborate cleaning of Process 2 does not improve the contact angle, but with the addition of the UV-ozone treatment, the contact angle is reduced to zero.

EXAMPLE IV

The contact angle was measured again under the conditions described in Example I. The substrates were Si, SiO$_2$, SiN and SION.

In Process 1, the substrates were immersed for five minutes in d-limonene, followed by a five minute immersion in an ultrasonic bath of d-limonene. It was immersed for five minutes in isopropyl alcohol, followed by a five minute immersion in an ultrasonic bath of isopropyl alcohol. It was immersed for two minutes in a surfactant known as FC93 surfactant, 50 ppm in DI water. It was subjected to three five minute cascading DI water rinses, followed by a vacuum bake at one hundred twenty degrees Centigrade for thirty minutes at twenty-eight inches of mercury.

In Process 2, the substrate was cleaned in accordance with Process 1. Additionally, it was given a five minute UV-ozone exposure at fifty degrees Centigrade.

The results of the processes are given in Table IV.

TABLE IV

| Process | Contact Angle (Degrees) Substrate | | | |
|---|---|---|---|---|
| | Si | SiO$_2$ | SiN | SiON |
| 1 | 29 | 51 | 49 | 53 |
| 2 | 0 | 0 | 0 | 0 |

Table IV again shows that the UV-ozone treatment in addition to the other cleaning treatment is essential to reduce contact angle.

While the invention has been discussed in terms of treating the substrate for reducing the contact angle, the treatment could be done after the device 12 of FIG. 1 has been bonded on the substrate 11. In this case, the treatment would effect the surfaces of the device, as well as the substrate, which may improve adhesion of the encapsulant on the device and therefore give added protection. Substrates of materials other than those explicitly mentioned, such as ceramic, and III-V semiconductor compounds and their oxides could be used. Encapsulants other than silicone, for example, epoxy, polyimide, paralene, or polyurethane, could be used. Various other embodiments and modifications may be made by those skilled in the art without departing from the spirit and scope of the invention.

I claim:

1. A method for encapsulating an electronic device supported on a substrate comprising the steps of:
   cleaning the substrate;
   mounting an electronic device on one surface of the substrate;
   encasing the electronic device in a fluid encapsulant; and
   causing the encapsulant to harden and to adhere to both the substrate and the device;
   wherein the cleaning step comprises the steps of:
   immersing the substrate in an organic solvent;
   subjecting the immersed substrate to acoustic energy;
   removing the organic solvent from the substrate; and
   exposing the substrate to ultraviolet light in an environment containing ozone to provide to the substrate a relatively low contact angle, thereby to increase wetting of the substrate by the fluid encapsulant.

2. The method of claim 1 wherein:

the step of removing the organic solvent comprises the step of baking the substrate.

3. The method of claim 2 wherein:
prior to baking, the substrate is immersed in an alcohol while subjecting the substrate to acoustic energy.

4. The method of claim 2 wherein:
prior to baking, the substrate is subjected to a rinse in deionized water.

5. The method of claim 3 wherein:
after said immersing in alcohol and prior to baking, the substrate is subjected to a rinse in deionized water.

6. The method of claim 5 wherein:
prior to the water rinse and after immersing in alcohol, the substrate is immersed in a surfactant.

7. The method of claim 6 wherein:
the substrate is subjected to ultraviolet radiation for about five minutes.

8. The method of claim 7 wherein:
the cleaning step occurs prior to the mounting step.

9. The method of claim 7 wherein:
the cleaning step occurs after the mounting step, whereby the electronic device is cleaned along with the substrate.

10. The method of claim 6 wherein:
while immersed in surfactant, the substrate is subjected to acoustic energy.

11. A method for encapsulating an electronic device supported on a first surface of a substrate comprising the steps of:

immersing the substrate in an organic solvent;
subjecting the immersed substrate to acoustic energy;
removing the organic solvent from the substrate;
providing to the first surface of the substrate a relatively low contact angle comprising the step of exposing the first surface of the substrate to ultraviolet light in an environment containing ozone;
completely encasing the electronic device in a fluid encapsulant, the fluid encapsulant covering at least part of the first surface of the substrate; and
causing the encapsulant to harden and to adhere to both the substrate and the device.

12. The method of claim 11 wherein:
the fluid encapsulant is an uncured polymer precursor; and
the step of causing the encapsulant to harden comprises the step of polymerizing the fluid encapsulant to cause it to become a solid.

13. The method of claim 12 wherein:
the electronic device is an integrated circuit; and
the substrate is selected from the group consisting of Si, $SiO_2$, SiN, SiON, ceramic, and a III-V semiconductor compound.

14. The method of claim 12 wherein:
said encapsulant is selected from the group consisting of silicone, epoxy, polyimide, Parylene and polyurethane.

15. The method of claim 14 wherein:
said substrate is selected from the group consisting of $SiO_2$, SiN, SiON and ceramic.

* * * * *